(12) United States Patent
Weber et al.

(10) Patent No.: US 11,894,382 B2
(45) Date of Patent: Feb. 6, 2024

(54) SET OF INTEGRATED STANDARD CELLS

(71) Applicants: STMicroelectronics France, Montrouge (FR); STMicroelectronics (Crolles 2) SAS, Crolles (FR)

(72) Inventors: Olivier Weber, Grenoble (FR); Christophe Lecocq, Varces (FR)

(73) Assignees: STMicroelectronics France, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/544,665

(22) Filed: Dec. 7, 2021

(65) Prior Publication Data

US 2022/0199648 A1   Jun. 23, 2022

(30) Foreign Application Priority Data

Dec. 17, 2020  (FR) ..................................... 2013447

(51) Int. Cl.
*H01L 27/12* (2006.01)
*H01L 21/84* (2006.01)
*H01L 21/8238* (2006.01)
*H01L 27/02* (2006.01)
*H01L 27/092* (2006.01)

(52) U.S. Cl.
CPC .. *H01L 27/1203* (2013.01); *H01L 21/823807* (2013.01); *H01L 21/84* (2013.01); *H01L 27/0207* (2013.01); *H01L 27/092* (2013.01)

(58) Field of Classification Search
CPC ............. H01L 27/1203; H01L 27/0207; H01L 27/092; H01L 21/823807; H01L 21/84; H01L 29/76854; H01L 27/11807
USPC .................................. 257/347; 438/149, 479
See application file for complete search history.

(56) References Cited

U.S. PATENT DOCUMENTS

| | | | |
|---|---|---|---|
| 2014/0077300 A1 | 3/2014 | Noel et al. | |
| 2014/0312423 A1 | 10/2014 | Cheng et al. | |
| 2017/0358565 A1* | 12/2017 | Hensel et al. | ...... H01L 27/0207 |
| 2018/0083005 A1 | 3/2018 | Andrieu et al. | |
| 2020/0357806 A1* | 11/2020 | Liaw | .................. H01L 27/1104 |

\* cited by examiner

*Primary Examiner* — Thinh T Nguyen
(74) *Attorney, Agent, or Firm* — Seed IP Law Group LLP

(57) ABSTRACT

An integrated circuit includes at least a first standard cell framed by two second standard cells. The three cells are disposed adjacent to each other, and each standard cell includes at least one NMOS transistor and at least one least one PMOS transistor located in and on a silicon-on-insulator substrate. The at least one PMOS transistor of the first standard cell has a channel including silicon and germanium. The at least one PMOS transistor of each second standard cell has a silicon channel and a threshold voltage different in absolute value from the threshold voltage of said at least one PMOS transistor of the first cell.

12 Claims, 6 Drawing Sheets

[Fig 1]
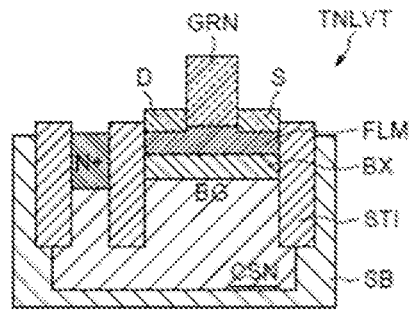
[Fig 2]
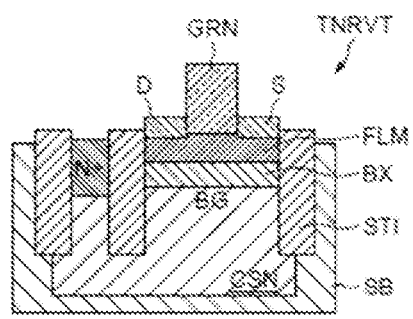
[Fig 3]
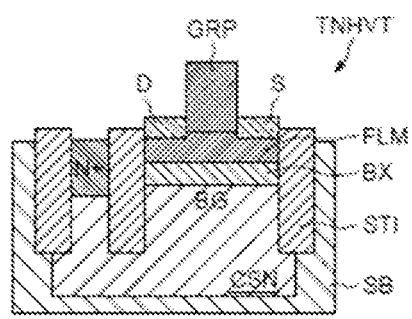
[Fig 4]
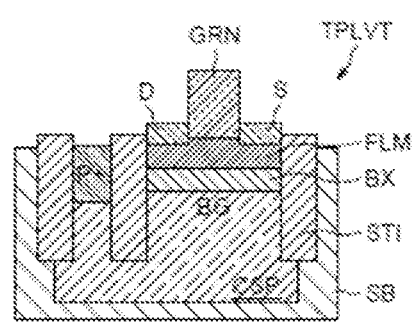

[Fig 5]
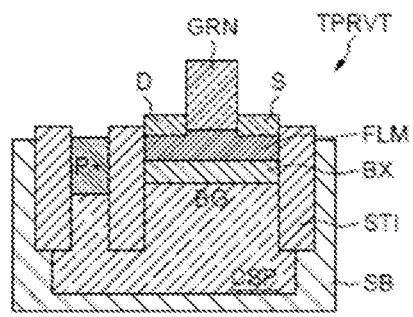
[Fig 6]
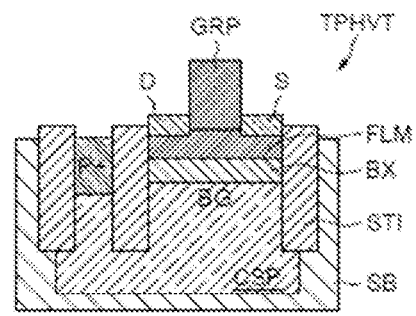

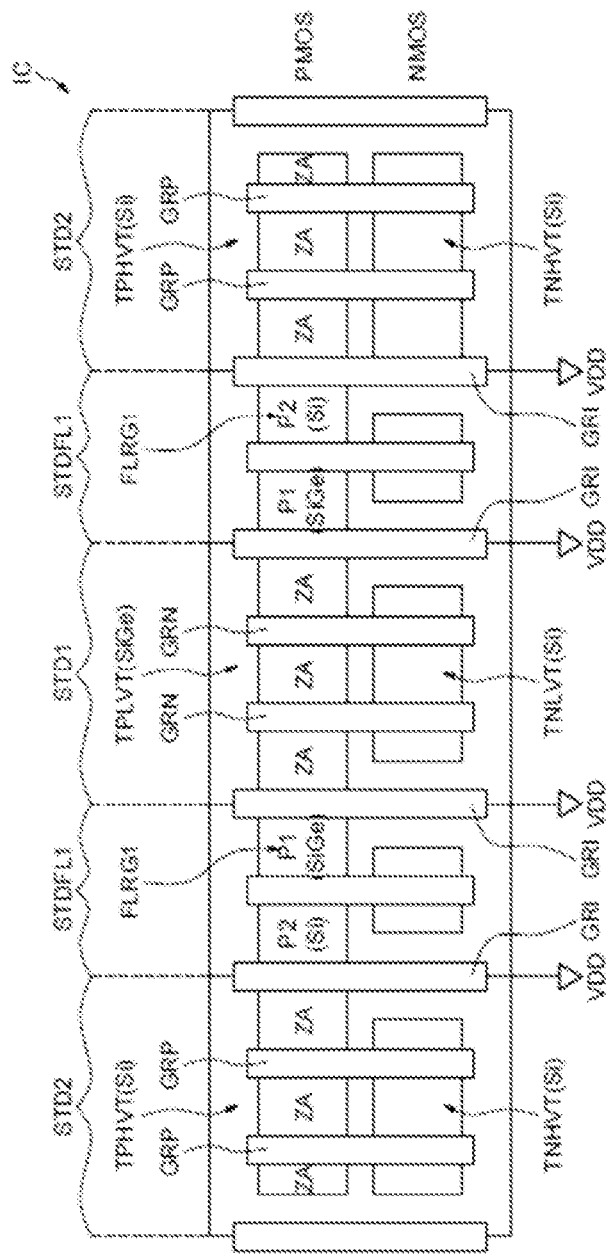
[Fig 7]

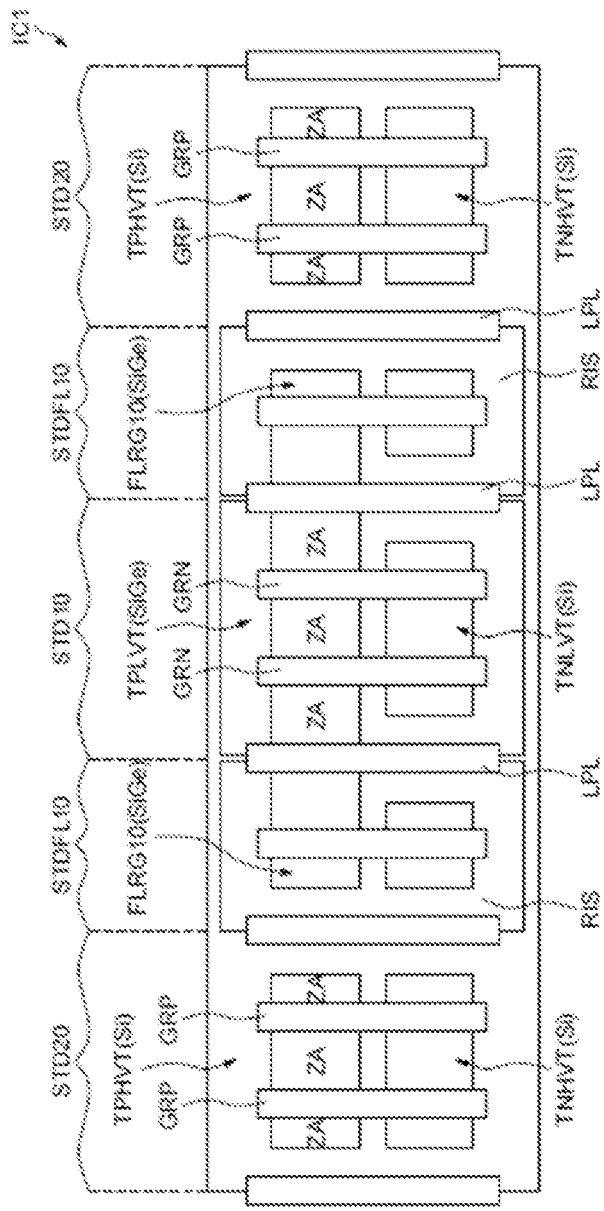
[Fig. 8]

[Fig 9]
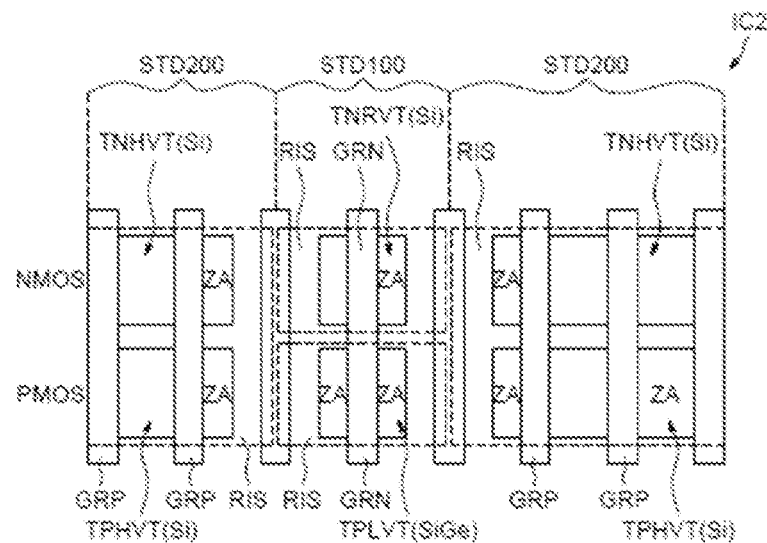
[Fig 10]
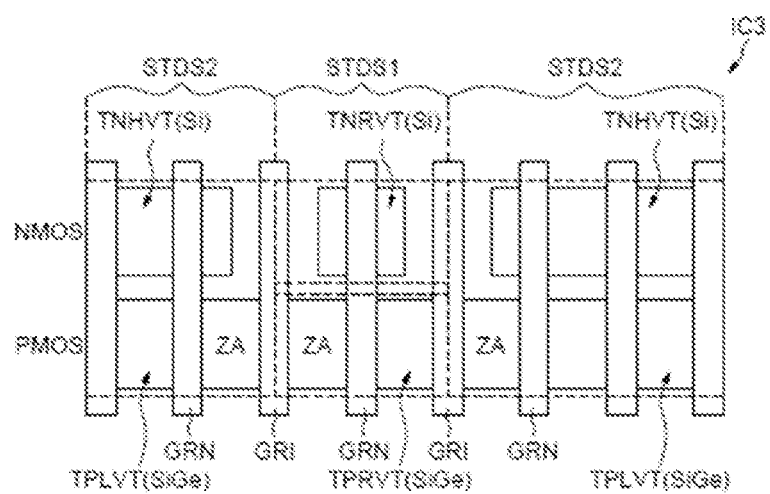

[Fig 11]
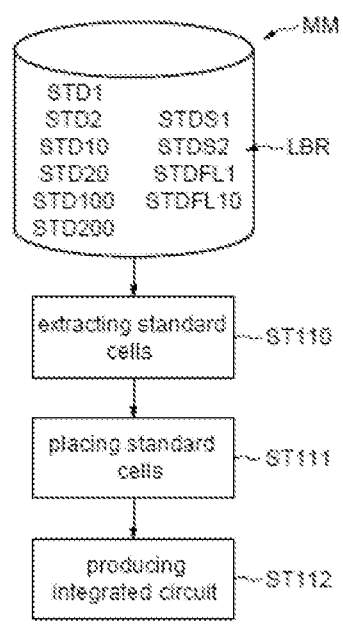

SET OF INTEGRATED STANDARD CELLS

BACKGROUND

Technical Field

Implementations and embodiments of the present disclosure relate to the field of microelectronics, in particular integrated circuits and more particularly standard cells, such as those used for the design of digital logic circuits of integrated circuits.

Description of the Related Art

Among the transistors used in an integrated circuit, for example, produced on a Silicon-On-Insulator (SOI) type substrate, it may be useful to use:
  low voltage threshold transistors (Low VT: Voltage Threshold) having, for example, a threshold voltage of the order of 0.25 volts in absolute value,
  regular voltage threshold transistors (RVT: Regular Voltage Threshold) having, for example, a threshold voltage of the order of 0.35 volts in absolute value, and
  high voltage threshold (HVT) transistors typically having a threshold voltage of the order of 0.45 volts in absolute value.

These concepts of low, regular and high voltage thresholds are well known to the person skilled in the art and depend on the value of the technological node, and the numerical values indicated above are given for a technological node less than 90 nm at around ten percent.

Low voltage threshold and regular voltage threshold transistors, in particular when they include an SiGe channel, that is to say including silicon and germanium, are used in particular for the production of critical paths because they have a high speed and good current performance, that is to say having a current in the on state (Ion current) typically greater than 500 microamperes/micrometre.

On the other hand, such transistors have significant leaks, that is to say a relatively high current Ioff in the off state of the transistor, typically of the order of 1 nanoampere/micrometre up to 20 or 30 nanoamperes/micrometre.

Moreover, it is interesting to use silicon channel high voltage threshold transistors because they have a low leakage current, typically of the order of 0.05 nanoamperes/micrometre.

Currently, one can find on the same technological platform integrated circuits or portions of integrated circuits using exclusively SiGe channel transistors and other integrated circuits or other portions of the same integrated circuit, using exclusively silicon channel transistors such as high voltage threshold transistors.

However, such an arrangement consumes space.

There is therefore a need to be able to combine, within a single integrated circuit, both silicon germanium channel transistors of the low voltage threshold and regular voltage threshold type and silicon channel transistors of the high voltage threshold type.

BRIEF SUMMARY

According to one or more embodiments, an integrated circuit is provided that includes at least a first standard cell framed by two second standard cells.

The three cells are disposed adjacent to each other that is to say that they are either directly adjoined or butting together or indirectly butting together, that is to say by means of one or more several other standard cells, for example, cells called filling cells as will be seen in more detail below.

Thus two adjacent cells are, for example, spaced apart by a distance which may be zero or less than or equal to a hundred nanometres.

Each cell includes at least one NMOS transistor and at least one PMOS transistor located in and on a silicon-on-insulator type substrate.

Said at least one PMOS transistor of the first standard cell has a channel including silicon and germanium.

Said at least one PMOS transistor of each second standard cell has a silicon channel and a threshold voltage different from, for example, greater in absolute value than, the threshold voltage of said at least one PMOS transistor of the first cell.

Thus, the problem of surface congestion is solved by placing standard cells including silicon germanium channel PMOS transistors and silicon channel PMOS transistors adjacent to each other. It is thus possible to mix transistors with different threshold voltage, in particular silicon germanium channel low voltage threshold and regular voltage threshold transistors with silicon channel high voltage threshold transistors.

There are several solutions for disposing these standard cells adjacent to each other.

The inventors have indeed observed that placing a silicon germanium channel transistor and a silicon channel transistor against each other could cause a drop in performance which can be inconvenient in some applications.

Also, according to one variant, the integrated circuit may further include a semiconductor connection region connecting the active area of said at least one PMOS transistor of the first standard cell (the one with the SiGe channel) and the active area of the PMOS transistors of the second standard cells (those with a silicon channel).

The semiconductor connection region comprises in particular an insulating gate allowing to insulate the two active areas from one another, but the semiconductor connection region forms, with the active areas of the transistors, a continuous active region and therefore allows to avoid an active cut which would induce a relaxation of the stress induced by silicon germanium, penalising the performance of the concerned SiGe channel transistors.

And, so as not to penalise too much the performance of the silicon germanium channel PMOS transistor, provision is made, according to an embodiment compatible with this variant, for the integrated circuit to comprise at least two standard cells called filling cells framing the first standard cell, respectively disposed between the first standard cell and the two second standard cells, and respectively butted to the first standard cell and to the two second standard cells.

Each filling cell includes:
  a filling region having a first part containing silicon and germanium in contact with the active area of the PMOS transistor of the first standard cell and a second part containing silicon in contact with the active area of the PMOS transistor of the second corresponding standard cell, and
  two first polysilicon lines (forming insulating gates) located above the border between the filling cell and the first standard cell or the second standard cell respectively, and intended to be biased at a supply voltage VDD.

These filling regions form said semiconductor connection region.

The fact of adding these filling silicon germanium regions allows not to relax too much the stress in the silicon germanium channel of the PMOS transistor and therefore limits the performance losses of the silicon germanium channel PMOS transistor.

However, in order not to penalise too much the performance of the silicon channel transistor, it is particularly advantageous to break this continuous semiconductor area and to provide a cut between the active area of the silicon channel transistor and the active area of the silicon germanium channel transistor, while still using filling cells containing silicon and germanium so as not to penalise the performance of the SiGe channel PMOS transistor.

Thus, according to one embodiment, the integrated circuit comprises at least two standard cells called filling cells framing the first standard cell, respectively disposed between the first standard cell and the two second standard cells, respectively butted to the first standard cell and to the two second standard cells.

Each filling cell includes a filling region containing silicon and germanium, adjoined to the active area of the PMOS transistors of the first standard cell and at least a first polysilicon line located above the filling region and intended to remain electrically floating.

Moreover, the filling regions are separated from the active area of said at least one PMOS transistor of each second standard cell (that is to say silicon channel PMOS transistors) by an insulating region.

Regardless of the embodiments, said at least one PMOS transistor of the first standard cell can be a low voltage threshold transistor and said at least one PMOS transistor of the second standard cell can be a high voltage threshold transistor.

It is also possible that said at least one PMOS transistor of the first standard cell is a regular voltage threshold transistor and that said at least one PMOS transistor of the second standard cell is a high voltage threshold transistor.

However, the embodiments which have just been mentioned occupy a certain place on silicon due to the presence of the filling cells. And, in some applications, it may be advantageous to further reduce this surface congestion.

This is why, in another variant, it is planned to dispense with these standard filling cells and also to break the continuity of the active areas.

Thus, according to another variant, said at least one NMOS transistor of the first standard cell has a silicon channel and a threshold voltage, for example, a regular voltage threshold, equal to or preferably greater in absolute value than the threshold voltage, for example, a low voltage threshold, of said at least one PMOS transistor of this first standard cell.

Moreover, the active area of said at least one PMOS transistor of this first standard cell is electrically insulated from the active area of said at least one PMOS transistor of each second standard cell.

Thus, in this variant, for example, a mixture of a transistor with a high voltage threshold and silicon channel and a transistor with a regular voltage threshold is obtained using a standard cell not including a regular voltage threshold NMOS transistor and a regular voltage threshold PMOS transistor but using a regular voltage threshold NMOS transistor and a low voltage threshold silicon germanium channel PMOS transistor.

The fact of using a low voltage threshold transistor on a silicon germanium channel allows to compensate, in terms of leakage current in particular, the drop in performance caused by the break between the active areas of the PMOS transistors of the second cells and of the PMOS transistor of the first cell.

In such a variant, the first standard cell can advantageously be adjoined to each second standard cell.

As indicated previously, said at least one NMOS transistor of the first cell can be a regular voltage threshold transistor, said at least one PMOS transistor of the first cell can be a low voltage threshold transistor and said at least one PMOS transistor of each second cell can be a high voltage threshold transistor.

According to yet another embodiment, it is also possible for the integrated circuit to comprise a set of three additional standard cells forming a set having good performance in terms of current in the on state (Ion current).

This set of additional cells can, for example, be added in the integrated circuit to at least one of the sets of standard cells defined above.

Thus, in this embodiment, the integrated circuit further comprises another set of a first additional standard cell framed by two second additional standard cells.

The three additional cells are adjoined (butted) and each include at least one NMOS transistor having a silicon channel and at least one PMOS transistor having a channel containing silicon and germanium.

The active areas of all PMOS transistors form a continuous semiconductor area.

The threshold voltage of said at least one PMOS transistor of the first additional cell is different in absolute value from the threshold voltage of the PMOS transistors of the second additional cells.

And the integrated circuit further includes two polysilicon lines intended to be biased at a supply voltage and respectively disposed above the border between the active area of said at least one PMOS transistor of the first additional cell and said at least one PMOS transistor of each second additional cell.

Said at least one PMOS transistor of the first additional cell can be a low voltage threshold transistor and the PMOS transistors of the second additional cells can be regular voltage threshold transistors.

Regardless of the variant and the embodiment, the silicon-on-insulator type substrate can be a substrate of the Fully Depleted Silicon On Insulator (FDSOI) type.

According to another embodiment, a method for manufacturing an integrated circuit is provided that includes:

storing in a memory of a library of standard cells intended to be produced on a silicon-on-insulator type substrate and including at least a first standard cell, and a second standard cell, each cell including at least one NMOS transistor and at least one PMOS transistor, said at least one PMOS transistor of the first standard cell having a channel including silicon and germanium, said at least one PMOS transistor of the second standard cell having a silicon channel and a threshold voltage different from, for example, greater in absolute value than, the threshold voltage of said at least PMOS transistor of the first cell extracting these standard cells from the memory and placing these cells so that they are disposed adjacent to each other, the first standard cell being framed by two second standard cells, and producing the integrated circuit from said placement of these cells.

According to one implementation, the first standard cell includes an insulating region surrounding the active area of said at least one NMOS transistor and the active area of said at least one PMOS transistor, the second standard cell includes an insulating region at least partially surrounding the active area of said at least one NMOS transistor and the active area of said at least one PMOS transistor, each NMOS transistor of the first standard cell has a silicon channel and a threshold voltage equal to, and preferably greater in absolute value than, the threshold voltage of each PMOS transistor of this first standard cell, and each PMOS transistor of the second standard cell has a threshold voltage greater in absolute value than the threshold voltage of each NMOS transistor of the first cell.

Moreover, provision is made for the placement of the first standard cell framed by two second standard cells so that the active area of the PMOS transistor of the first standard cell is electrically insulated from the active areas of the PMOS transistors of the two second cells.

According to one implementation, said at least one NMOS transistor of the first cell is a regular voltage threshold transistor, said at least one PMOS transistor of the first cell is a low voltage threshold transistor and said at least one PMOS transistor of the second cell is a high voltage threshold transistor.

According to one implementation, the library of standard cells further comprises a first additional standard cell and a second additional standard cell, the additional cells each including at least one NMOS transistor having a silicon channel and at least one PMOS transistor having a channel containing silicon and germanium, and the threshold voltage of said at least one PMOS transistor of the first additional cell being different in absolute value from the threshold voltage of said at least one PMOS transistor of the second additional cell, and said placement further comprises disposing these additional cells so that the first additional cell is framed in an adjoining manner by two second additional cells, the active areas of the PMOS transistors of all the additional cells forming a continuous semiconductor area, at least one of the first additional cell or the second additional cell having on its edge a polysilicon line above the corresponding active area intended to be biased at a supply voltage.

According to one implementation, said at least one PMOS transistor of the first additional cell is a low voltage threshold transistor and said at least one PMOS transistor of the second additional cell is a regular voltage threshold transistor.

According to another embodiment, a standard cell is provided, intended to be produced on a silicon-on-insulator type substrate and including at least one NMOS transistor having a silicon channel and at least one PMOS transistor having a channel including silicon and germanium and a threshold voltage lower in absolute value than the threshold voltage of said at least one NMOS transistor, and an insulating region surrounding the active area of said at least one NMOS transistor and the active area of said at least one PMOS transistor.

According to one embodiment, said at least one NMOS transistor is a regular voltage threshold transistor and said at least one PMOS transistor is a transistor having a low voltage threshold.

BRIEF DESCRIPTION OF THE SEVERAL VIEWS OF THE DRAWINGS

Other advantages and features of the disclosure will become apparent upon examining the detailed description of embodiments and implementations, which are in no way limiting, and of the appended drawings wherein:

FIGS. 1 through 6 schematically illustrate NMOS and PMOS transistors having different threshold voltages, produced on a silicon-on-insulator type substrate, for example, of the fully depleted silicon-on-insulator type, in accordance with one or more embodiments.

FIG. 7 schematically illustrates an integrated circuit including a first standard cell framed by two second standard cells by means of two filling cells, in accordance with one or more embodiments.

FIG. 8 schematically illustrates an integrated circuit including a first standard cell including two germanium silicon channel PMOS transistors having polysilicon lines forming their gates, in accordance with one or more embodiments.

FIG. 9 schematically illustrates an integrated circuit including a first standard cell framed in a butted manner by two second standard cells, in accordance with some embodiments.

FIG. 10 schematically illustrates an integrated circuit including a first additional standard cell framed in a butted manner by two second additional standard cells, in accordance with one or more embodiments.

FIG. 11 schematically illustrates a method of manufacturing an integrated circuit, in accordance with one or more embodiments.

DETAILED DESCRIPTION

FIGS. 1 to 6 schematically illustrate NMOS and PMOS transistors having different threshold voltages, produced on a silicon-on-insulator type substrate, for example, of the fully depleted silicon-on-insulator type.

The NMOS transistors which will be used in the standard cells described below have a silicon channel.

The PMOS transistors that will be used in the standard cells described below have a silicon germanium channel, with the exception of the high voltage threshold PMOS transistor which has a silicon channel.

In FIG. 1, the reference TNLVT denotes a low voltage threshold NMOS transistor, typically of the order of 0.25 volts.

This NMOS transistor is produced in and on a semiconductor film FLM disposed above a buried insulating region BX (known to the person skilled in the art under the name BOX: Buried OXyde).

The buried insulating layer BX is located above an N-type doped semiconductor well CSN formed in a semiconductor substrate SB.

The part of the well CSN located under the buried layer BX forms a rear gate BG biased here by an N+ type contact disposed between two insulation regions STI.

The transistor TNLVT also includes raised regions of source and drain S and D as well as a gate GRN here containing a metal having an N-type output work.

This transistor TNLVT has an all-silicon channel.

The semiconductor film FLM is here intrinsic silicon, that is to say having a dopant concentration of less than $10^{11}$ atoms/cm$^3$.

The transistor TNRVT illustrated in FIG. 2 is a regular voltage threshold NMOS transistor, that is to say of the order of 0.35 volts.

The transistor TNRVT is distinguished from the transistor TNLVT of FIG. 1 by the doping of the semiconductor film FLM.

Indeed, for the transistor TNRVT, the film FLM has a dopant concentration of the order of $10^{18}$ atoms/cm$^3$.

This transistor TNRVT can be a silicon channel transistor.

FIG. 3 illustrates an NMOS transistor TNHVT having a high voltage threshold, typically of the order of 0.45 volts.

This transistor TNHVT can also have a silicon channel.

It is distinguished from the transistor TNRVT in FIG. 2 by the fact that it includes a gate GRP containing a metal having a P-type output work while the transistor TNRVT has a GRN containing a metal having an N-type output work.

The dopant concentration of the film FLM of the transistor TNHVT can be identical to that of the film FLM of the transistor TNRVT of FIG. 2.

FIGS. 4 to 6 illustrate PMOS transistors with different threshold voltages.

FIG. 4 illustrates a PMOS transistor TPLVT having a low voltage threshold having a channel including silicon and germanium, for example, an $Si_{1-x}Ge_x$ alloy where x is comprised between 0.1 (10%) and 0.4 (40%), preferably equal to 0.2 (20%).

It has a structure similar to that of the NMOS transistor TNLVT of FIG. 1 but is distinguished by the type of dopants.

More specifically, for the transistor TPLVT, the semiconductor well wherein the rear gate BG is located is a P-type doped well CSP that can be biased by a P+ contact.

The source and drain regions S and D are P-doped. In contrast, the gate GRN contains a metal having an N-type output work.

Since the threshold voltage is a low voltage, the film FLM is intrinsic silicon germanium.

The transistor TPRVT of FIG. 5 is a regular voltage threshold PMOS transistor which has a silicon germanium channel and which is simply distinguished from the transistor TPLVT of FIG. 4 by the concentration of dopants of the film FLM which may be equivalent to the concentration of dopants of the film FLM of the transistor TNRVT of FIG. 2.

The transistor TPHVT shown in FIG. 6 is a silicon channel high voltage threshold PMOS transistor.

This transistor TPHVT is distinguished from the transistor TPRVT of FIG. 5, on the one hand, by the fact that the gate GRP of this transistor TPHVT contains a metal having a P-type output work, and on the other hand, by the fact that the channel of the transistor TPHVT contains intrinsic silicon and not silicon germanium (SiGe) which allows to increase the threshold voltage of the PMOS transistor by 250 mV or 300 mV in absolute value.

In the remainder of the text, a transistor whose reference ends in LVT is a low voltage threshold transistor, a transistor whose reference ends in RVT is a regular voltage threshold transistor and a transistor whose reference ends in HVT is a high voltage threshold transistor.

In FIG. 7, the reference IC designates an integrated circuit including in this example a first standard cell STD1 framed by two second standard cells STD2 by means of two filling cells STDFL1.

More specifically, the first standard cell STD1 here includes two SiGe channel PMOS transistors TPLVT(SiGe) and two Si channel NMOS transistors TNLVT(Si).

The active areas ZA of these two transistors TPLVT (SiGe) are surmounted by polysilicon lines forming gates GRN of these transistors.

Each second standard cell STD2 here includes two silicon channel PMOS transistors TPHVT(Si) and two silicon channel NMOS transistors TNHVT(Si).

The active areas ZA of these transistors TPHVT(Si) are also surmounted by polysilicon lines forming the gates GRP of these transistors TPHVT.

Each filling cell STDFL1 includes a filling region FLRG1 including a first part P1 formed of silicon germanium contacting the active areas ZA of the transistors TPLVT (SiGe) and a second part P2 containing silicon contacting the active areas ZA of the transistors TPHVT(Si), so as to form a continuous semiconductor area.

The two parts P1 and P2 form two buffer areas (SiGe on the TPLVT side and Si on the TPHVT side) allowing the Si/SiGe transition to be absorbed.

The integrated circuit also includes two lines of polysilicon GRI.

Each line GRI overlaps the border between the filling cell STDFL1 and the cell STD1 or STD2, respectively.

These polysilicon lines GRI are connected to the supply voltage VDD, for example, of the order of 1 volt, so as to form an insulating gate allowing to electrically insulate the transistor TPHVT(Si) from the transistor TPLVT(SiGe).

The polysilicon line located between the two insulation gates GRI can remain floating.

The embodiment of FIG. 8 is distinguished from that of FIG. 7 in particular in that there is no longer a continuous semiconductor area between the silicon channel transistors TPHVT(Si) and the silicon germanium channel transistor TPLVT(SiGe).

Indeed, this continuity is broken at the edge of the transistor TPHVT(Si) so as not to degrade the performance of this transistor.

More specifically, an integrated circuit IC1 here includes a first standard cell STD10 again including two germanium silicon channel PMOS transistors TPLVT(SiGe), the active areas ZA of which are surmounted by the polysilicon lines GRN forming their gate.

This first standard cell STD10 also includes two silicon channel NMOS transistors TNLVT(Si).

The first standard cell STD10 is framed by two second standard cells STD20 by means of two filling cells STDFL10.

Each second standard cell STD20 here includes two silicon channel PMOS transistors TPHVT(Si) and two silicon channel NMOS transistors TNHVT(Si).

The active areas ZA of the PMOS transistors are surmounted by two polysilicon lines forming the gates GRP of these PMOS transistors.

Each filling cell STDFL10 includes a filling region FLRG10 formed of silicon and germanium extending the active areas ZA of the transistors TPLVT(SiGe).

On the other hand, each filling cell includes an insulating region RIS allowing to insulate the filling region FLRG10 from the active area ZA of the transistor TPHVT(Si) of the corresponding second standard cell STD20.

In order to keep a silicon line pitch, silicon lines LPL, kept floating, can be inserted between the gates of the different transistors.

In order to save space, it is possible to eliminate the filling cells while dispensing with a continuous semiconductor area containing all the active areas of the PMOS transistors, that is to say by breaking this continuity.

In this regard, provision can be made of a first standard cell containing an NMOS transistor and a PMOS transistor having the same threshold voltage, for example, regular voltage threshold transistors, framed in a butting manner by two second standard cells having silicon channel PMOS transistors having, for example, high voltage thresholds.

However, in this case, the performance of the PMOS transistor of the first standard cell is degraded, in particular as regards the Ion current, which can be inconvenient in some applications.

To overcome this loss of performance, it is also possible to use a first "hybrid" standard cell, that is to say having an NMOS transistor and a PMOS transistor having different threshold voltages, typically a PMOS transistor having a lower threshold voltage in absolute value than that of the NMOS transistor.

An example of such a configuration is illustrated in FIG. 9.

In this FIG. 9, an integrated circuit IC2 includes a first standard cell STD100 framed in a butted manner by two second standard cells STD200.

The first cell STD100 includes a silicon channel NMOS transistor TNRVT(Si) and a silicon germanium channel PMOS transistor TPLVT(SiGe).

An insulating region RIS (for example, comprising silicon dioxide) surrounds each active area ZA of the transistors TNRVT and TPLVT.

It is therefore seen here that unlike the usual standard cells, the threshold voltage of the NMOS transistor is different from the voltage of the PMOS transistor.

More specifically, the NMOS transistor TNRVT(Si) is a regular voltage threshold transistor while the PMOS transistor TPLVT(SiGe) is a low voltage threshold transistor but which in reality will have, as indicated below, a regular type voltage threshold due to the breaking of the active areas.

Each second standard cell STD200 here includes two silicon channel NMOS transistors TNHVT(Si) and two silicon channel PMOS transistors TPHVT(Si).

The active areas ZA of these transistors are surmounted by polysilicon lines forming the gates GRP of these transistors.

Here again, the active areas ZA of these transistors are at least partially surrounded by an insulating region RIS.

Due to the non-continuity of the active areas between the PMOS transistors of the first and second standard cells, the threshold voltage of the transistor TPLVT will increase in absolute value and the Ion current performance of this PMOS transistor TPLVT(SiGe) is impacted and this Ion current decreases.

The transistor TPLVT will therefore behave like a regular voltage threshold transistor, and with the same threshold voltage level.

This embodiment is therefore remarkable in that it provides a mixture of high voltage threshold and silicon channel transistors with regular voltage threshold and SiGe channel transistors while limiting the congestion due to the absence of filling cells.

There is therefore a set of standard cells providing a mixture of transistors with different threshold voltages and low leakage (low current Ioff).

Other sets of standard cells are possible in the integrated circuit as shown in FIG. 10. These other sets can be added in the integrated circuit to the set of cells in FIG. 9 for example.

An integrated circuit IC3 of FIG. 10 includes a first additional standard cell STDS1 framed in a butted manner by two second additional standard cells STDS2.

The first cell STDS1 includes a silicon germanium channel PMOS transistor TPRVT(SiGe) and a silicon channel NMOS transistor TNRVT(Si).

The active area of these transistors is surmounted by the polysilicon line GRN forming the gate of these transistors.

Each second additional cell STDS2 includes a silicon germanium channel PMOS transistor TPLVT(SiGe) and a silicon channel NMOS transistor TNLVT(Si). Here again, the active area ZA of these transistors is surmounted by the polysilicon line GRN forming the gate of these transistors.

The active areas ZA of the PMOS transistors of these additional cells contact one another to form a continuous semiconductor area.

In order to electrically insulate the transistor TPLVT (SiGe) from the transistor TPRVT(SiGe), a polysilicon line GRI biased at the supply voltage VDD overlaps the border between the active areas ZA of the transistors TPRVT(SiGe) and TPLVT(SiGe).

Here, a set of standard cells providing a mixture of transistors with different threshold voltages and high performance in terms of Ion current, are therefore obtained.

Reference is now made more particularly to FIG. 11 to illustrate an example of the implementation of a method.

A library LBR of standard cells including in particular the cells STD1, STD2, STD10, STD20, STD100, STD200, STDS1, STDS2, STDFL1 and STDFL10 mentioned above, was stored in a memory MM.

It should be noted here that even if all these cells were represented in the memory MM, the cells STDS2, STD1 and STD10 are identical in terms of elementary cell characterization (LVT type cell) and only their adjoining will differ.

The same is true for the cells STD20 and STD200 which are identical in terms of elementary cell characterization (HVT type cell).

Then, in a step ST110, an extraction of some of these standard cells then a placement ST111 of these extracted cells are performed so as to obtain the desired configuration for the integrated circuit part to be produced, such as, for example, the configurations illustrated in FIGS. 7 to 10.

Then, from this placement of cells, the integrated circuit IC, IC1, IC2 or IC3 is produced in a conventional manner known per se (step ST112).

An integrated circuit may be summarized as including at least a first standard cell (STD100) framed by two second standard cells (STD200), the three cells being disposed adjacent to each other, each cell including at least one NMOS transistor (TNRVT) and at least one PMOS transistor (TPLVT) located in and on a silicon-on-insulator type substrate, said at least one PMOS transistor (TPLVT) of the first standard cell (STD100) having a channel including silicon and germanium, said at least one PMOS transistor (TPHVT) of each second standard cell having a silicon channel and a threshold voltage different in absolute value from the threshold voltage of said at least one PMOS transistor (TPLVT) of the first cell.

The integrated circuit may further include a semiconductor connection region (FLRG1) connecting the active area of said at least one PMOS transistor of the first standard cell (STD1) and the active area of the PMOS transistors of the second standard cells (STD2).

The integrated circuit may include at least two standard cells (STDFL1) called filling cells framing the first standard cell, respectively disposed between the first standard cell (STD1) and the two second standard cells (STD2), respectively butted to the first standard cell and to the two second standard cells, each filling cell including a filling region (FLRG1) having a first part (P1) containing silicon and germanium in contact with the active area of the PMOS transistor of the first standard cell and a second part (P2) containing silicon in contact with the active area of the PMOS transistor of the second corresponding standard cell, and two first polysilicon lines (GRI) located above the border between the filling cell and the first standard cell (STD1) or the second standard cell (STD 2) respectively, and intended to be biased at a supply voltage, the filling regions forming said semiconductor connection region.

The integrated circuit may include at least two standard cells (STDFL10) called filling cells framing the first standard cell (STD10), respectively disposed between the first standard cell (STD10) and the two second standard cells (STD20), respectively butted to the first standard cell and to the two second standard cells, each filling cell including a filling region containing silicon and germanium, adjoined to the active area of the PMOS transistors of the first standard cell and at least a first polysilicon line located above the filling region and intended to remain electrically floating, the filling regions being separated from the active area of said at least one PMOS transistor of each second standard cell by an insulating region (RIS).

Said at least one PMOS transistor of the first standard cell may be a low voltage threshold transistor (TPLVT) and said at least one PMOS transistor of the second standard cell may be a high voltage threshold transistor (TPHVT). Said at least one PMOS transistor of the first standard cell may be a regular voltage threshold transistor (TPRVT) and said at least one PMOS transistor of the second standard cell may be a high voltage threshold transistor (TPHVT). Said at least one NMOS transistor of the first standard cell (STD100) may have a silicon channel and a threshold voltage equal to, or preferably greater in absolute value than, the threshold voltage of said at least one PMOS transistor of this first standard cell, and the active area of said at least one PMOS transistor of this first standard cell may be electrically insulated from the active area of said at least one PMOS transistor of each second standard cell (STD200). The first standard cell (STD100) may be adjoined to each second standard cell (STD200). Said at least one NMOS transistor of the first cell (STD100) may be a regular voltage threshold transistor (TNRVT), said at least one PMOS transistor of the first cell (STD100) may be a low voltage threshold transistor (TPLVT) and said at least one PMOS transistor of each second cell (STD200) may be a high voltage threshold transistor (TPHVT).

The integrated circuit may further include another set of a first additional standard cell (STDS1) framed by two second additional standard cells (STDS2), the three additional cells being adjoined and each including at least one NMOS transistor having a silicon channel and at least one PMOS transistor having a channel containing silicon and germanium, the active areas of all PMOS transistors forming a continuous semiconductor area, the threshold voltage of said at least one PMOS transistor of the first additional cell being different in absolute value from the threshold voltage of the PMOS transistors of the second additional ones and the integrated circuit further including two polysilicon lines intended to be biased at a supply voltage and respectively disposed above the border between the active area of said at least one PMOS transistor of the first additional cell and said at least one PMOS transistor of each second additional cell.

Said at least one PMOS transistor of the first additional cell (STDS1) may be a low voltage threshold transistor (TPLVT) and the PMOS transistors of the second additional cells (STDS2) may be regular voltage threshold transistors (TPRVT). The silicon-on-insulator type substrate may be a fully depleted silicon-on-insulator type substrate.

A method for manufacturing an integrated circuit may be summarized as including: a storage in a memory (MM) of a library (LBR) of standard cells intended to be produced on a silicon-on-insulator type substrate and including at least a first standard cell, and a second standard cell, each cell including at least one NMOS transistor and at least one PMOS transistor, said at least one PMOS transistor of the first standard cell having a channel including silicon and germanium, said at least one PMOS transistor of the second standard cell having a silicon channel and a threshold voltage different in absolute value from the threshold voltage of said at least one PMOS transistor of the first cell; extracting (ST110) these standard cells from the memory and placing (ST111) these cells so that they are disposed adjacent to each other, the first standard cell being framed by two second standard cells; and producing (ST112) the integrated circuit from said placement of these cells.

The first standard cell may include an insulating region surrounding the active area of said at least one NMOS transistor and the active area of said at least one PMOS transistor, the second standard cell may include an insulating region at least partially surrounding the active area of said at least one NMOS transistor and the active area of said at least one PMOS transistor, each NMOS transistor of the first standard cell may have a silicon channel and a threshold voltage greater in absolute value than the threshold voltage of each PMOS transistor of this first standard cell, and each PMOS transistor of the second standard cell has a threshold voltage greater in absolute value than the threshold voltage of each NMOS transistor of the first cell, and wherein the placement of the cells may include placing the first standard cell (STD100) framed in an adjoining manner by two second standard cells (STD200) so that the active area of the PMOS transistor of the first standard cell is electrically insulated from the active areas of the PMOS transistor of the two second cells. Said at least one NMOS transistor of the first cell may be a regular voltage threshold transistor (TNRVT), said at least one PMOS transistor of the first cell may be a low voltage threshold transistor (TPLVT) and said at least one PMOS transistor of the second cell may be a high voltage threshold transistor (TPHVT). The library of standard cells may further include a first additional standard cell (STDS1) and a second additional standard cell (STDS2), the additional cells each including at least one NMOS transistor having a silicon channel and at least one PMOS transistor having a channel containing silicon and germanium, and the threshold voltage of said at least one PMOS transistor of the first additional cell being different in absolute value from the threshold voltage of said at least one PMOS transistor of the second additional cell, and said placement may further include disposing these additional cells so that the first additional cell is framed by two second additional cells, the active areas of the PMOS transistors of all the additional cells forming a continuous semiconductor area, at least one of the first additional cell or the second additional cell having on its edge a polysilicon line above the corresponding active area intended to be biased at a supply voltage. Said at least one PMOS transistor of the first additional cell may be a low voltage threshold transistor (TPLVT) and said at least one PMOS transistor of the second additional cell may be a regular voltage threshold transistor (TPRVT).

A standard cell may be summarized as intended to be produced on a silicon-on-insulator type substrate and including at least one NMOS transistor (TNRVT) having a silicon channel and at least one PMOS transistor (TPLVT) having a channel including silicon and germanium and a threshold voltage equal to, or preferably lower in absolute value than, the threshold voltage of said at least one NMOS transistor, and an insulating region surrounding the active area of said at least one NMOS transistor and the active area of said at least one PMOS transistor.

Said at least one NMOS transistor may be a regular voltage threshold transistor (TNRVT) and said at least one PMOS transistor may be a transistor having a low voltage threshold (TPLVT).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a silicon-on-insulator substrate;
   at least a first standard cell framed by two second standard cells, the three cells being disposed adjacent to each other, each cell including:
      at least two NMOS transistors and at least two PMOS transistors located in and on the silicon-on-insulator substrate, the at least two PMOS transistors of the first standard cell having a channel including silicon and germanium, the at least two NMOS transistors of each second standard cell having a silicon channel and a threshold voltage different in absolute value from a threshold voltage of the at least two PMOS transistors of the first standard cell.

2. The integrated circuit according to claim 1, comprising a semiconductor connection region coupling an active area of at least one of the at least two PMOS transistors of the first standard cell and an active area of the PMOS transistors of the second standard cells.

3. The integrated circuit according to claim 2, comprising at least two standard filling cells adjacent to the first standard cell, respectively disposed between the first standard cell and the two second standard cells, respectively butted to the first standard cell and to the two second standard cells, each of the at least two standard filling cells including a filling region having a first part containing silicon and germanium in contact with the active area at least one of the at least two PMOS transistors of the first standard cell and a second part containing silicon in contact with the active area of at least one of the at least two PMOS transistors of the second corresponding standard cell, and two first polysilicon lines located above a border between the filling cell and the first standard cell or the second standard cell respectively, and configured to be biased at a supply voltage, the filling regions forming the semiconductor connection region.

4. The integrated circuit according to claim 1, comprising at least two standard cells called filling cells framing the first standard cell, respectively disposed between the first standard cell and the two second standard cells, respectively butted to the first standard cell and to the two second standard cells, each filling cell including a filling region containing silicon and germanium, adjoined to the active area of at least one of the at least two PMOS transistors of the first standard cell and at least a first polysilicon line located above the filling region and configured to remain electrically floating, the filling regions being separated from the active area of at least one of the at least two PMOS transistors of each second standard cell by an insulating region.

5. The integrated circuit according to claim 2, wherein at least one of the at least two PMOS transistors of the first standard cell is a low voltage threshold transistor and at least one of the at least two PMOS transistors of the second standard cell is a high voltage threshold transistor.

6. The integrated circuit according to claim 2, wherein at least one of the at least two PMOS transistors of the first standard cell is a regular voltage threshold transistor and at least one of the at least two PMOS transistors of the second standard cell is a high voltage threshold transistor.

7. The integrated circuit according to claim 1, wherein at least one of the at least two NMOS transistors of the first standard cell has a silicon channel and a threshold voltage equal to or greater in absolute value than the threshold voltage of at least one of the at least two PMOS transistors of the first standard cell, and the active area of at least one of the at least two PMOS transistors of the first standard cell is electrically insulated from the active area of at least one of the at least two PMOS transistors of each second standard cell.

8. The integrated circuit according to claim 7, wherein the first standard cell is adjoined to each second standard cell.

9. The integrated circuit according to claim 7, wherein at least one of the at least two NMOS transistors of the first cell is a regular voltage threshold transistor, at least one of the at least two PMOS transistors of the first cell is a low voltage threshold transistor and at least one of the at least two PMOS transistors of each second cell is a high voltage threshold transistor.

10. The integrated circuit according to claim 7, further comprising another set of a first additional standard cell framed by two second additional standard cells, the three additional cells being adjoined and each including at least one NMOS transistor having a silicon channel and at least one PMOS transistor having a channel containing silicon and germanium, the active areas of all PMOS transistors forming a continuous semiconductor area, the threshold voltage of the at least one PMOS transistor of the first additional standard cell being different in absolute value from the threshold voltage of the at least one PMOS transistors of the second additional standard cells and the integrated circuit further including two polysilicon lines configured to be biased at a supply voltage and respectively disposed above the border between the active area of the at least one PMOS transistor of the first additional standard cell and the at least one PMOS transistor of each second additional standard cell.

11. The integrated circuit according to claim 10, wherein the at least one PMOS transistor of the first additional standard cell is a low voltage threshold transistor and the PMOS transistors of the second additional standard cells are regular voltage threshold transistors.

12. The integrated circuit according to claim 1, wherein the silicon-on-insulator type substrate is a fully depleted silicon-on-insulator type substrate.

* * * * *